United States Patent
Miura et al.

(10) Patent No.: US 7,368,763 B2
(45) Date of Patent: May 6, 2008

(54) SEMICONDUCTOR DEVICE AND MANUFACTURING METHOD THEREOF

(75) Inventors: Makoto Miura, Kokubunji (JP); Katsuya Oda, Hachioji (JP); Katsuyoshi Washio, Tokorozawa (JP)

(73) Assignee: Hitachi, Ltd., Tokyo (JP)

( * ) Notice: Subject to any disclaimer, the term of this patent is extended or adjusted under 35 U.S.C. 154(b) by 339 days.

(21) Appl. No.: 11/072,279

(22) Filed: Mar. 7, 2005

(65) Prior Publication Data
US 2006/0169987 A1 Aug. 3, 2006

(30) Foreign Application Priority Data
Jan. 13, 2005 (JP) .............................. 2005-005841

(51) Int. Cl.
*H01L 31/00* (2006.01)
*H01L 29/788* (2006.01)

(52) U.S. Cl. .................. 257/190; 257/77; 257/200; 257/201; 257/617; 257/618; 257/627; 257/628; 257/E33.003; 257/E33.006; 257/E31.049; 257/E29.104; 257/E29.105; 257/E21.699

(58) Field of Classification Search .............. 257/618, 257/627, E31.04, 13.77–79, 190, 194, 200, 257/201, 617, 628, E33.003, E33.006, E31.038, 257/E31.049, E29.104, E29.105, E21.699–E21.701
See application file for complete search history.

(56) References Cited

U.S. PATENT DOCUMENTS

| 5,032,893 | A | * | 7/1991 | Fitzgerald et al. | .......... 257/627 |
| 6,403,975 | B1 | * | 6/2002 | Brunner et al. | ................ 257/15 |
| 6,416,578 | B1 | * | 7/2002 | Nakano et al. | ................ 117/94 |
| 6,475,456 | B2 | * | 11/2002 | Nakano et al. | .......... 423/328.2 |
| 6,617,182 | B2 | * | 9/2003 | Ishida et al. | .................. 438/22 |
| 2003/0012249 | A1 | * | 1/2003 | Eisenbeiser | .................. 372/96 |
| 2003/0089921 | A1 | * | 5/2003 | Jordan et al. | ................ 257/200 |

FOREIGN PATENT DOCUMENTS

| JP | 6-216037 | 8/1994 |
| JP | 7-147461 | 6/1995 |
| JP | 2000-164929 | 6/2000 |
| JP | 2000-178740 | 6/2000 |

* cited by examiner

*Primary Examiner*—Jasmine J Clark
(74) *Attorney, Agent, or Firm*—Antonelli, Terry, Stout & Kraus, LLP.

(57) ABSTRACT

A high quality silicon carbide (SiC) layer being substantially lower in threading dislocation density than a prior layer is formed on silicon (Si) substrate. A semiconductor device is fabricated in such a way that a semiconductor buffer layer containing Si in part and being higher in defect density than a Si substrate is formed on the Si substrate on the upper portion of which are formed a plurality of pairs of facets being mirror-symmetrical to the surface orientation of a semiconductor substrate, further on the top of the layer a SiC layer is sequentially formed.

21 Claims, 17 Drawing Sheets

Prior Art

Prior Art

Prior Art

SEMICONDUCTOR DEVICE AND MANUFACTURING METHOD THEREOF

CROSS-REFERENCE TO RELATED APPLICATION

The present application claims priority from Japanese Patent Application No. JP 2005-5841 filed on Jan. 13, 2005, the content of which is hereby incorporated by reference into this application.

TECHNICAL FIELD OF THE INVENTION

The present invention relates to a semiconductor thin film comprised of silicon carbide (SiC) formed on, for example, a silicon (Si) substrate, and a method of manufacturing thereof, and in particular, to a semiconductor device in which the SiC film is formed as a virtual substrate for an electronic and a light emitting device and to a method of manufacturing thereof.

BACKGROUND OF THE INVENTION

Wide energy band gap semiconductor materials such as a III-nitride semiconductor and silicon nitride (SiC) have had a wide range of applications to light emitting elements in blue-ultraviolet range and high-frequency high-output devices and have been growing in importance more and more in late years. These materials are very expensive for a bulk substrate, so that heterogeneous materials are used as a substrate in fabricating devices. Desired semiconductor materials are formed as thin film on the abovementioned heterogeneous-material substrate by crystal growth such as chemical vapor deposition (CVD) method or molecular beam epitaxy (MBE) method. As materials for a III-nitride semiconductor represented by gallium nitride (GaN), for example, industrially inexpensive sapphire ($Al_2O_3$) is generally used, and silicon (Si) is used in a cubic crystal SiC substrate. However, these substrates are different from semiconductor materials formed thereon in lattice constant. For example, there exist a lattice mismatch of about 12% between a GaN and a sapphire substrate, and a lattice mismatch of as large as about 20% between SiC and a Si substrate. These lattice mismatches cause large strain between a substrate and a grown layer, producing a large number of defects such as threading dislocation and plane defect in the thin film, which markedly deteriorates device operation. For example, a III-nitride semiconductor formed on sapphire and SiC film formed on a SiC substrate have defects on the order of $10^8$ to $10^9/cm^2$. These defects lower a lifetime of a light emitting device and produce leak current in an electronic device.

It is effective to form a semiconductor layer acting as a buffer between a substrate and a grown film to suppress the development of defects and thereby to achieve a high quality semiconductor film. This method has been an effective thin-film forming technique related to lattice mismatch. In a device using a III-nitride semiconductor, for instance, a GaN layer grown at lower temperatures is inserted as a buffer between a sapphire substrate and the III-nitride semiconductor layer to upgrade the quality of crystal. In forming a SiC buffer layer on a Si substrate, the Si substrate is heated at temperatures of about 1300° C. using hydrocarbon-based gas such as propane ($C_3H_8$) before the SiC layer is crystal-grown. The buffer layer functionally prevents strains from propagating by containing defects therein, suppressing the production of defects in the film formed on the buffer layer.

Another method for achieving a high-quality thin film has been to control the direction in which defects propagate by patterning the substrate and grown film. This method is shown in FIG. 3 as a prior art disclosed in Japanese Patent Application Laid-Open Publication No. 12-164929.

On a semiconductor substrate 101 is formed a semiconductor film 102 different in lattice constant therefrom. Then the semiconductor film is patterned by using photo lithography and etching. At this point, facets 103 with given a certain angle to the upper surface of the substrate are formed on the semiconductor film. When a semiconductor film 104 comprised of the same materials as film 102 is grown on the patterned film 102, threading dislocations 105 extending toward the perpendicular direction from the substrate are refracted on the facets 103 to be oriented to the parallel direction with respect to the substrate surface, which suppresses the propagation of the dislocations to the perpendicular direction. These dislocations are again bent toward the perpendicular direction with respect to the semiconductor substrate when grown films extending from two opposing facets meet together. This divides the grown films into a lower defect-density area 106 and a higher defect-density area 107. The fabrication of a device in area 106 enables the formation of a high-performance semiconductor element. Another prior method of directly patterning the substrate has been disclosed in Japanese Patent Application Laid-Open Publication No. 12-178740 as shown in FIG. 4. This is fabricated in such a manner that a plurality of facets 202 arranged in [−110] direction are formed on Si substrate 201 with a (001) surface orientation and then a SiC film 203 is grown throughout substrate 201. Facets 202 will orient plane defects 204 produced in SiC film 203 toward (111) and (−1-11) planes, for example, thereby causing defects extending from the opposing facets to disappear together. This method is effective for a hard grown film difficult to pattern, for example, SiC layer. The above method allows decreasing threading dislocations extending to the surface of the grown film to $10^7/cm^2$.

Upgrading performances of devices requires further reduction of defects and threading dislocations. In high-output electronic device using III-nitride semiconductor and SiC, for example, a threading dislocation needs to be reduced to $10^3/cm^2$ to obtain a sufficient transistor performance in view of suppressing leak current and ensuring withstand voltage. Also in a light emitting device comprised of a III-nitride semiconductor, a defect density in a III-nitride semiconductor film is preferably about $10^5/cm^2$ to further improve light-emitting efficiency and lifetime. A presently optimum method is to use a substrate equal or near to a targeted semiconductor film in lattice constant to achieve a lower defect density. A SiC substrate different from GaN in a lattice constant of as small as 3% is available as a substrate for III-nitride semiconductor layer. The SiC substrate is effective as a substrate for high quality SiC film. The SiC substrate, however, is not suited industrially because it is expensive as compared to a sapphire or a Si substrate.

Accordingly such a lower defect density needs to be realized by the use of a sapphire or a Si substrate. It is not enough to use a single effect produced by the above buffer layer or patterning for this purpose. The number of threading dislocations that can be suppressed by the buffer layer only is limited. There always exist finite threading dislocations or defects of $10^7/cm^2$ or more on the grown-film surface. Even if a patterning effect is used, it is difficult to control precisely defects, and there still exist a large number of defects that do not disappear. In an example shown in FIG. 3, for instance, a high-defect-density area exists in a part of the surface and, in addition, the asymmetry of opposing facets causes dislocations to extend obliquely relative to the substrate surface after meeting, which may again increase dislocation density on the grown film surface. In an example shown in FIG. 4 as well, since defects are produced at random positions on facets 202, there exist a large number of dislocations and defects that do not meet and reach the surface.

The above description requires use of plural effects, for example, to decrease substantially the threading dislocation and defects. Disclosure in Japanese Patent Application Laid-Open Publication No. 6-216037 is an example of a prior art to ensure high quality crystal by combining the buffer layer with pattering. FIG. 5 shows the example of prior art in the publication. This is so constructed that a semiconductor layer 302 different from a semiconductor substrate 301 in lattice constant is stacked thereon, on which is formed a large number of teeth 303 with (111) plane, a buffer layer 304 for suppressing the propagation of threading dislocations is stacked throughout, and a semiconductor layer 305 comprised of the same material as or different material from the layer 302 is stacked. Defects 306 extending from layer 302 are bent by the buffer layer, extend toward [111] direction along the facets, meet the defects extending from the opposing facets, disappear and decrease. Unlike the example of prior art shown in FIG. 4, this prior example defines paths of defects, increasing a probability that defects meet together. However, a plurality of defects concentrate in the same path, which makes a defect density very large at the meeting position of defects. It is more probable that defects bend to the perpendicular direction with respect to the substrate and extends to the surface as the threading dislocation instead of completely disappearing.

Since strain is produced in the buffer layer to increase energy when defects are bent, not all defects are bent, some of them are propagated upward directly. Therefore, a defect density is still as high as $5 \times 10^6/cm^2$ on the grown-layer surface.

SUMMARY OF THE INVENTION

The present invention has been made in view of the above problems. Its purpose is to control precisely the production position and orientation of threading dislocations and defects by using an inexpensive substrate to provide a high quality semiconductor device whose defect density is sharply decreased and the manufacturing method thereof.

To solve the above problems the present invention purposes to leave selectively defects to have them disappear effectively by making a pair of facets mirror-symmetrical to the surface orientation of the substrate and by using a buffer layer between a semiconductor substrate and semiconductor layer.

For achieving this purpose a semiconductor device of the present invention is characterized by comprising a semiconductor substrate with the upper portion on which a plurality of pairs of opposing facets are arranged, a semiconductor buffer layer provided on the semiconductor substrate and being higher in defect density than the semiconductor substrate and a first semiconductor layer provided on the semiconductor buffer layer, being different from the semiconductor substrate in lattice constant, and containing constituent elements different from the semiconductor substrate, wherein the facets are different from the semiconductor substrate in surface orientation and respective pairs of facets each comprised of opposing two facets are mirror-symmetrical to the surface orientation of the semiconductor substrate.

In addition, a semiconductor device of the present invention is characterized by comprising a semiconductor substrate with the upper portion on which a plurality of pairs of opposing facets are arranged along the perpendicular directions respectively, a semiconductor buffer layer provided on the semiconductor substrate and being higher in defect density than the semiconductor substrate and a first semiconductor layer provided on the semiconductor buffer layer, being different from the semiconductor substrate in lattice constant, and containing constituent elements different from the semiconductor substrate, wherein the facets are different from the semiconductor substrate in surface orientation and respective pairs of facets each comprised of opposing two facets are mirror-symmetrical to the surface orientation of the semiconductor substrate.

The perpendicular directions along which the respective opposing facets are arranged are preferably [-110] and [110], and [-1-12] and [-110].

It is preferable that the semiconductor substrate has a surface orientation of (001), the respective opposing facets comprise (111) and (-1-11), and (-111) and (1-11) planes, an area surrounded by the facets forms a rectangular pattern on the surface of the semiconductor substrate, and the semiconductor buffer layer is formed throughout the semiconductor substrate.

It is preferable that the semiconductor substrate has a surface orientation of (111), the respective opposing facets comprise (1-10) and (-110), and (11-2) and (-1-12) planes, an area surrounded by the facets forms a rectangular pattern on the surface of the semiconductor substrate, and the semiconductor buffer layer is formed throughout the semiconductor substrate.

It is preferable that a plurality of pairs of defects being mirror-symmetrical to the surface orientation of the semiconductor substrate exist in the semiconductor buffer layer and the first semiconductor layer, and defects in each the layer gradually decrease in number toward the surface of the first semiconductor layer.

It is also preferable that the semiconductor buffer layer is lower than the first semiconductor layer in mechanical strength or interatomic bonding energy.

It is preferable that the semiconductor buffer layer is comprised of a plurality of layers each being different from one another in element composition, and the element composition therein gradually gets close to that in the first semiconductor layer according as the composition in the semiconductor substrate gets close to that in the first semiconductor layer.

As another example of the semiconductor buffer layer, it may be a multiple layered structure in which a first semiconductor buffer layer being lower than the first semiconductor layer in mechanical strength or interatomic bonding energy and a second semiconductor buffer layer being higher than the first semiconductor buffer layer in mechanical strength or interatomic bonding energy are repeated alternately.

As a more suitable example of the present invention, it is preferable to provide an electronic device or light emitting element on the first semiconductor layer.

As another suitable example related to the present invention, it is preferable to provide a second semiconductor layer comprised of a plurality of nitrogen-containing III-V semiconductor layers is provided on the first semiconductor layer, and an electronic device or light emitting element is provided on the second semiconductor layer and/or the first semiconductor layer and/or the semiconductor substrate.

It is preferable that the semiconductor substrate comprises silicon, the semiconductor buffer layer comprises a material containing silicon, germanium, and carbon, and the first semiconductor layer comprises a compound semiconductor containing silicon-carbon bonds.

As a method of manufacturing a semiconductor device, it is preferable that the method comprises the steps of forming a plurality of opposing pairs of facets on a semiconductor substrate, forming on at least a partial area in the semiconductor substrate at least one or more semiconductor buffer layers having higher defect density than the above semiconductor substrate, and forming a first semiconductor layer being different from the semiconductor substrate in lattice constant and containing elements different from those in the semiconductor substrate on at least a partial area in the semiconductor buffer layer, wherein the facets are different from the other parts of the semiconductor substrate in surface orientation, and respective pairs of facets each comprised of opposing two facets are mirror-symmetrical to the surface orientation of the semiconductor substrate.

It is preferable that a method of manufacturing a semiconductor device comprises the steps of forming a plurality of opposing pairs of facets along the respective perpendicular directions on a semiconductor substrate, forming on at least a partial area in the semiconductor substrate one or more semiconductor buffer layers having higher defect density than the semiconductor substrate and forming a first semiconductor layer being different from the semiconductor substrate in lattice constant and containing elements different from those in the semiconductor substrate on at least a partial area in the semiconductor buffer layer, wherein the facets are different from the semiconductor substrate in surface orientation and respective opposing facets are mirror-symmetrical to the surface orientation of the semiconductor substrate.

It is preferable to form the semiconductor buffer layer and the first semiconductor layer by vapor deposition method.

BRIEF DESCRIPTIONS OF THE DRAWINGS

DESCRIPTION OF THE PREFERRED EMBODIMENTS

The preferred embodiment for a semiconductor device related to the present invention is characterized in that a groove comprised of facets being mirror-symmetrical to the surface orientation of a substrate is arranged on a silicon (Si) substrate, for example, and on the substrate including the grooves are formed a semiconductor buffer layer including in part Si and silicon carbide (SiC) layer stepwise. A growing surface equal to the substrate in an surface orientation lies at the bottom of the groove and between the grooves at the beginning of and on the way of formation of the buffer and the SiC layer. In each semiconductor buffer and SiC layer, defects are produced with a higher probability from an angle part made by the growing surface and the above facet. The mirror symmetry of the facet with respect to the surface orientation of the substrate will also make the opposing defects themselves mirror-symmetrical to each other, characterized by pairing defects becoming meeting and disappearing.

Making the buffer layer more subject to the defect than the SiC layer allows the layer to include the defects. Thus, production of the defects with a higher probability at the specified positions relieves strain. The control of development of the defects causes the defects to disappear, realizing a less-strained and lower defect-density SiC layer.

In the semiconductor thin film related to the present invention, defects disappear with a higher probability by having each single defect meet together, making the density of defects threading the thin-film surface lower than an example of prior art 3. Intentional production of defects in a specific position to relieve strain causes the propagation of defects from the semiconductor buffer layer to be substantially suppressed. The above advantages of the present invention realize a high-quality SiC layer with an extremely lower threading dislocation density at the surface.

FIRST EMBODIMENT

Embodiments on a semiconductor device and the production method therefor related to the present invention are described in further detail with reference to accompanying drawings.

Figure 1:
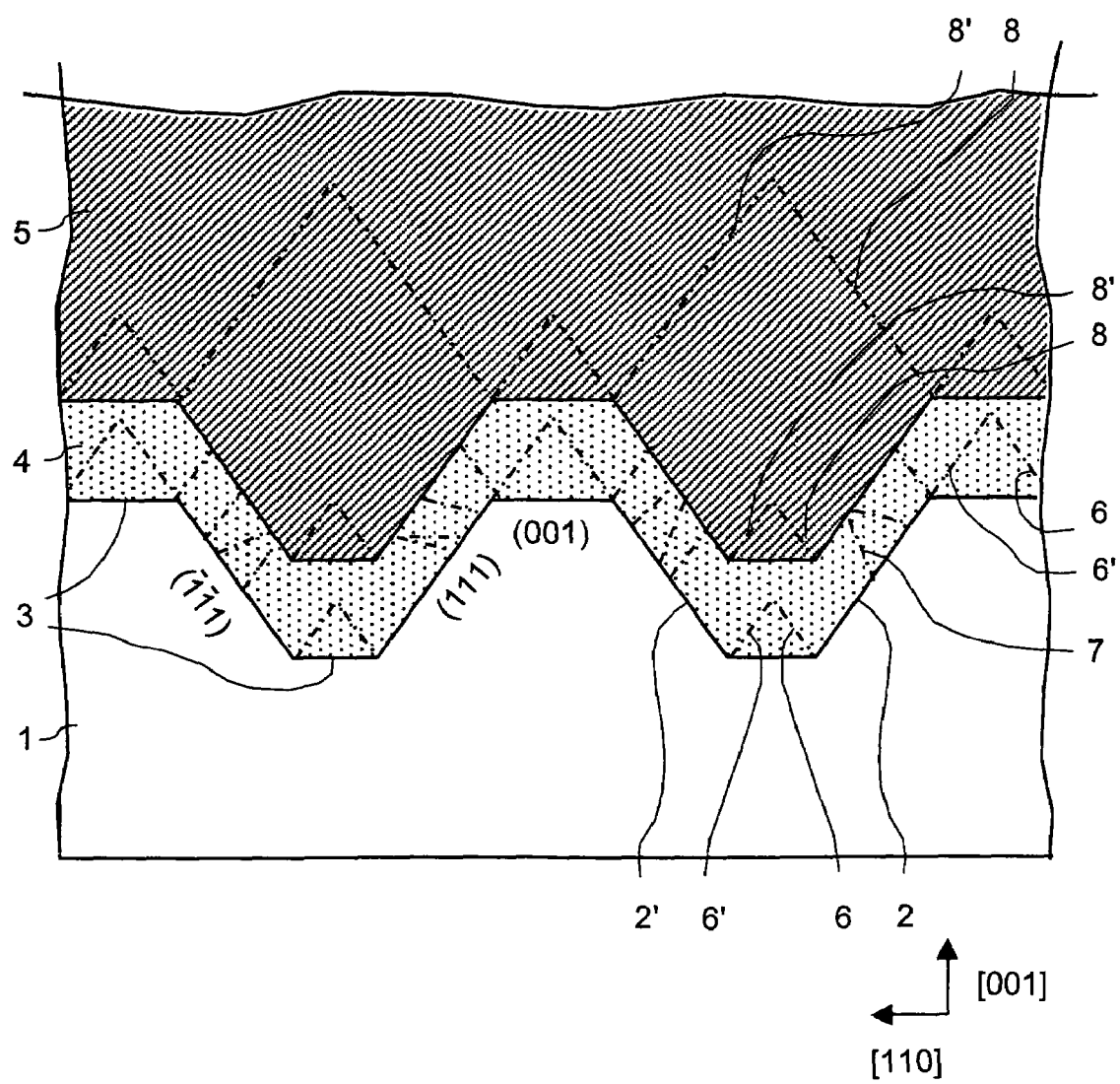
FIG. 1 is a cross sectional view of a first embodiment of a semiconductor device related to the present invention.

FIG. 1 a cross sectional view of a first embodiment of a semiconductor thin film related to the present invention. On a single crystal silicon (Si) substrate 1 are formed a plurality of pair of facets 2 and 2' arranged in line. A threading dislocation density at the substrate surface where the facets are formed is less than $1/cm^2$. At this point, the opposing facets 2 and 2' have a form being mirror-symmetrical to an axis perpendicular to the substrate, i.e., to the surface orientation of the substrate. On the bottom of the grooves formed by the facets themselves and between the adjacent grooves lie flat portions 3. The flat portions do not always need to exist when the facets are formed, but it is preferable to form them in advance as shown in FIG. 1. An example without the flat portions is described later in a manufacturing method. FIG. 1 shows an example using a Si(001) substrate. In this case, opposing facets are (111) and (−1-11) planes. On the Si substrate 1 is formed a buffer layer 4 including Si as a part of materials, and a silicon carbide (SiC) layer 5 as well. It is preferable to use in the buffer layer 4 a material weaker in mechanical strength than that of the SiC layer 5 or smaller in interatomic bonding energy. In this embodiment, it is possible to use a SiC layer formed by carbonization or low-temperature growth, or a silicon germanium carbide (SiGeC) layer including Ge—C bond smaller than Si—C bond in bonding energy.

An angle portion made by a facet 2 and flat portion 3 is liable to be subjected to stress, producing defects 6 and 6' toward the buffer layer 4. These defects become (−111) and (1-11) planes stable as slip plane, or plane defects with the same (111) and (−1-11) planes as facet 2. Since the opposing defects 6 and 6' are mirror-symmetrical to the surface orientation of the substrate, these defects meet themselves in the buffer layer 4 or SiC layer 5, and then disappear. In the SiC layer 5, similarly, defects 8 and 8' being mirror-symmetrical to the surface orientation of the substrate are produced from an angle portion made by a facet 2 and flat portion 3, meeting themselves and disappearing. In the thin film shown in FIG. 1, strain lying between SiC layer 5 and Si substrate 1 is positively relieved by intentionally forming defects 6 and 6' and 8 and 8' at specific positions, and these defects are caused to disappear completely to achieve the SiC layer with non strain and low defect density. Meeting of the defects 6 and 6' and 8 and 8' causes disappearance with a higher probability than a example 3 of prior art because single defects meet each other respectively. The random production of defects 7 in the buffer layer 4 contributes to the relief of strain in the SiC layer 5, but these defects hardly propagate to the SiC layer 5. This is because intentionally producing the defects 8 and 8' in the SiC layer 5 causes an area relieving strain to exist in the SiC layer 5, and terminating defects extending from the buffer layer 4 at an interface with the SiC layer 5 compensates a produced strain energy. The above advantages enable the formation of high quality SiC layer with an extremely fewer threading dislocation density of $10^3/cm^2$ or less.

Figure 2A:
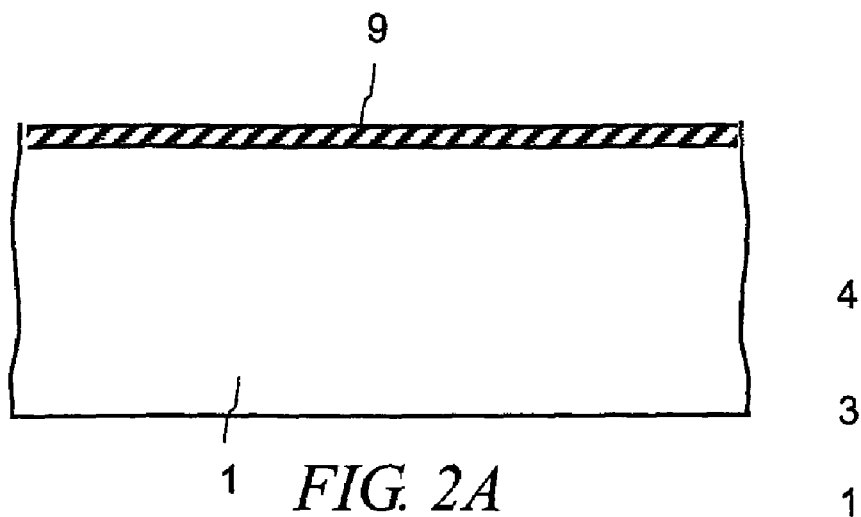
FIG. 2A is a cross sectional view of a first embodiment on a method of manufacturing a semiconductor device related to the present invention.
Figure 2B:
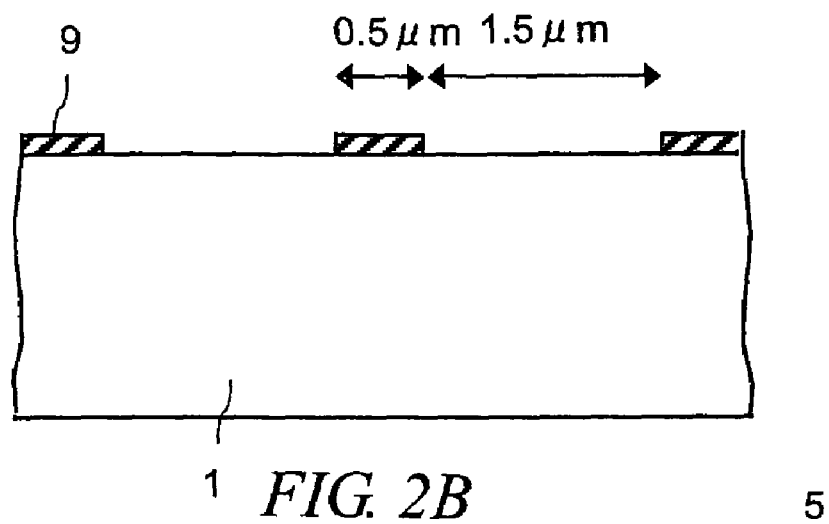
FIG. 2B is a cross sectional view of a first embodiment on a method of manufacturing a semiconductor device related to the present invention.

A method of manufacturing a semiconductor thin film in the present embodiment is described in detail with reference to FIGS. 2A-2E. First, as shown in FIG. 2A, an insulating film 9 such as silicon oxide film ($SiO_2$) or silicon nitride film ($Si_3N_4$) is deposited on Si substrate 1. The insulating film may be preferably one tenth to one fifth of a thickness of a pattern depth formed later. It has been set at 50 nm to 100 nm in the present embodiment. Then, the insulating film is patterned by photolithography with use of mask pattern arranged toward the [−110] direction and selective etching as shown in FIG. 2B. Dry or wet etching is used for etching the insulating film. When wet etching is used, it is advisable to use hydrofluoric acid (HF) aqueous solution for etching a $SiO_2$ film and 80° C. heated phosphoric acid for etching a $Si_3O_4$ film. Pattern width and pattern space may be determined by the density of defects produced in a semiconductor buffer layer, i.e., the pattern width and space are preferably smaller when a defect density is higher, on the contrary, they are preferably larger when the density is lower. In forming a SiC layer on the Si substrate as in the present embodiment, it is preferable that a pattern width is about 0.5 μm, for example, and a pattern space is about 1.5 μm, for example.

Figure 2C:
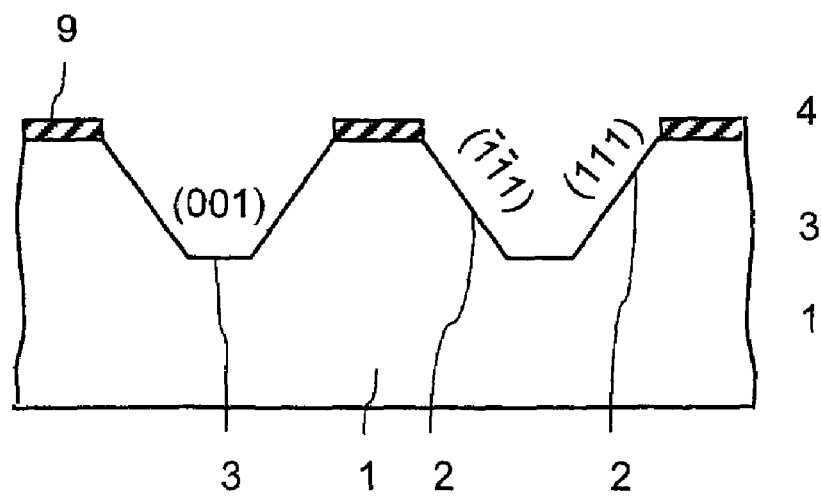
FIG. 2C is a cross sectional view of a first embodiment on a method of manufacturing a semiconductor device related to the present invention.
Figure 2D:
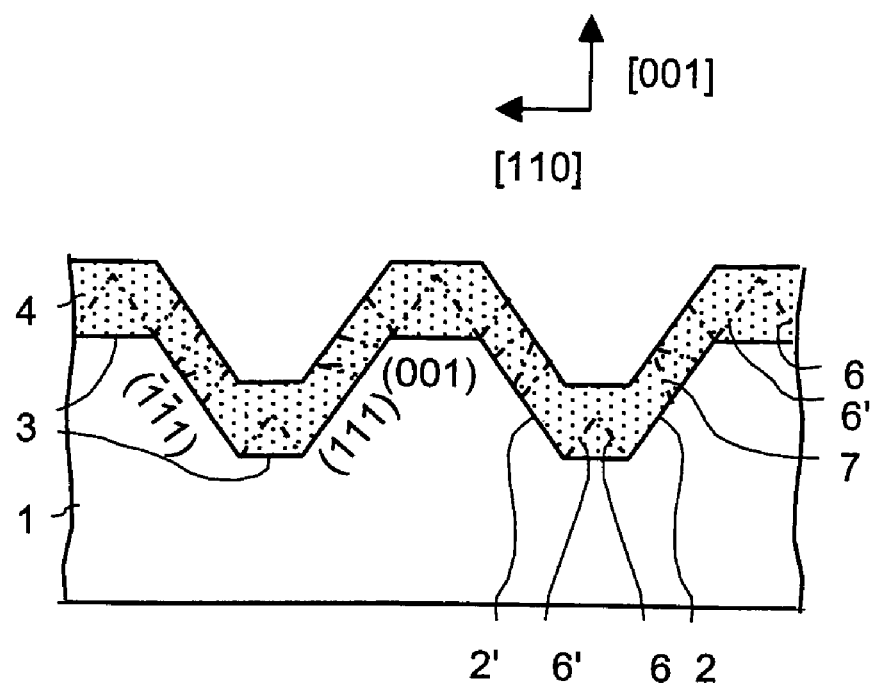
FIG. 2D is a cross sectional view of a first embodiment on a method of manufacturing a semiconductor device related to the present invention.

Then, an anisotropy wet etching of Si is conducted with the insulating film as a mask. Alkali solution such as potassium hydroxide (KOH), ammonium hydroxide ($NH_4OH$) or hydrazine monohydrate ($N_2H_4.H_2O$), for example, is used as an etchant for Si. The anisotropy etching forms facets 2 and 2' with stable (111) and (−1-11) planes on the Si substrate as shown in FIG. 2C. At this point an etching time is controlled so as to leave portions 3 with a surface orientation (001) of the substrate on the bottom of the grooves formed by (111) and (−1-11) planes. The insulating film is removed by etching and then a semiconductor buffer layer 4 is formed throughout the Si substrate as shown in FIG. 2D. It is best suitable to use a SiC layer formed by carbonization, SiC layer formed at lower temperatures, or SiGeC layer, for example, as a material for the buffer layer 4. The carbonized SiC layer can be obtained by heating the Si substrate up to 1300° C. to 1400° C. in an atmosphere of acetylene ($C_2H_2$) or propane ($C_3H_8$), for example. Here, the substrate is processed at high temperatures to sufficiently react Si in the Si substrate with carbon C in the gas. It is advisable to use vapor deposition method, for example, for forming thin films of the low-temperature SiC layer and the SiGeC layer. In forming the low-temperature growth SiC layer, for example, it is advisable to use monomethyl silane ($CH_3SiH_3$) as feed gas and to form at 400° C. to 700° C. as thin-film forming conditions. At the growth temperatures to this extent the SiC layer will be imperfectly crystalline and contains more defects. In forming the SiGeC layer, for example, it is preferable to use mixed gas of $CH_3SiH_3$ and germane ($GeH_4$), mixed gas of $CH_3SiH_3$ and monomethyl germane ($CH_3GeH_3$), mixed gas of monosilane ($SiH_4$) and $CH_3GeH_3$, or mixed gas of disilane ($Si_2H_6$) and $CH_3GeH_3$.

Figure 2E:
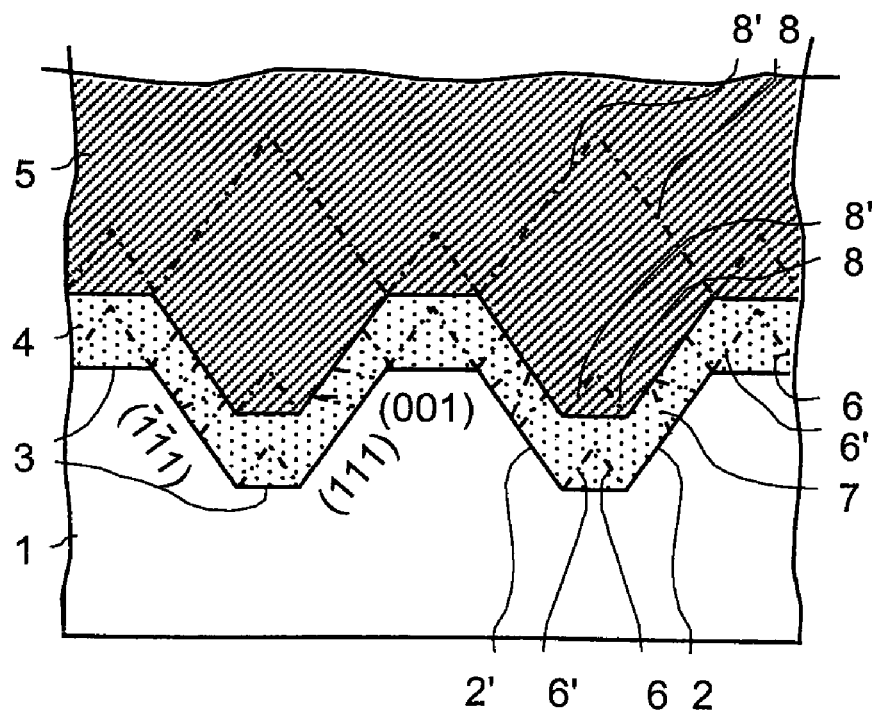
FIG. 2E is a cross sectional view of a first embodiment on a method of manufacturing a semiconductor device related to the present invention.
Figure 3:
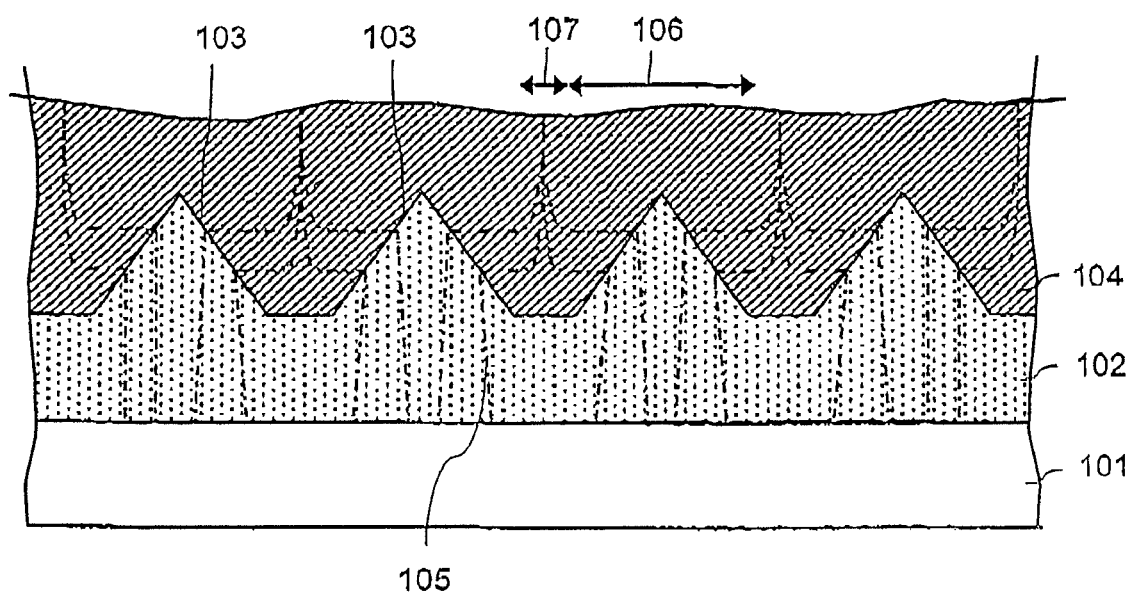
FIG. 3 is a cross sectional view of a first prior art example of a semiconductor device formed on a substrate different in lattice constant therefrom.
Figure 4:
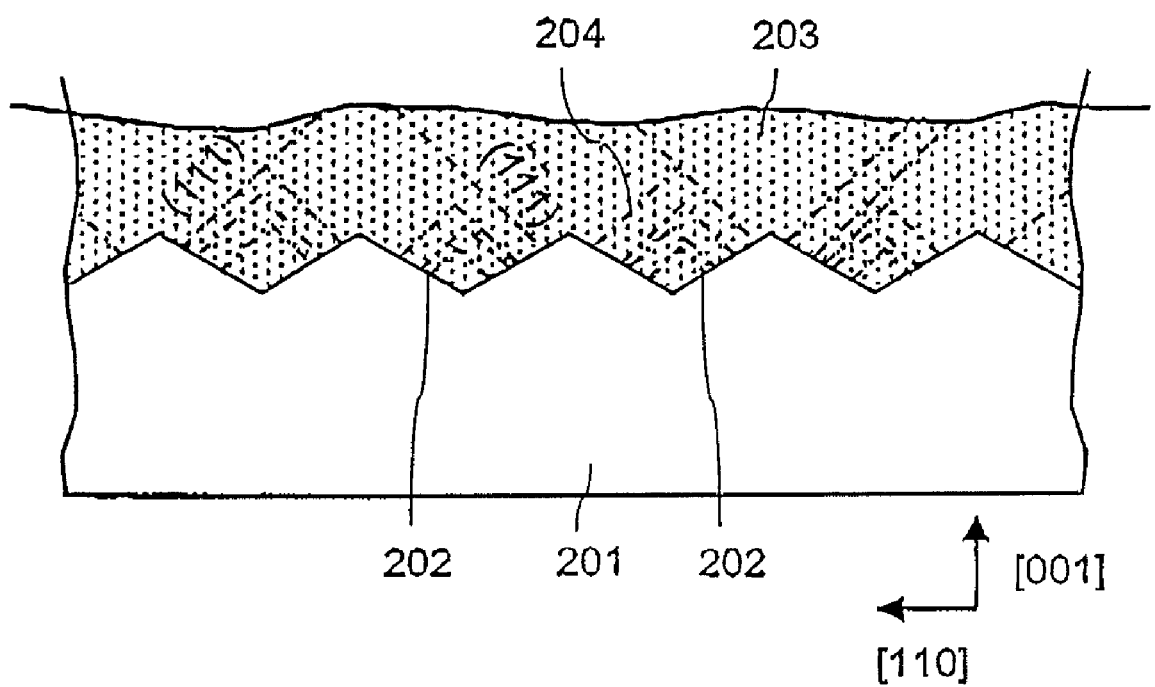
FIG. 4 is a cross sectional view of a second prior art example of a semiconductor device formed on a substrate different in lattice constant therefrom.
Figure 5:
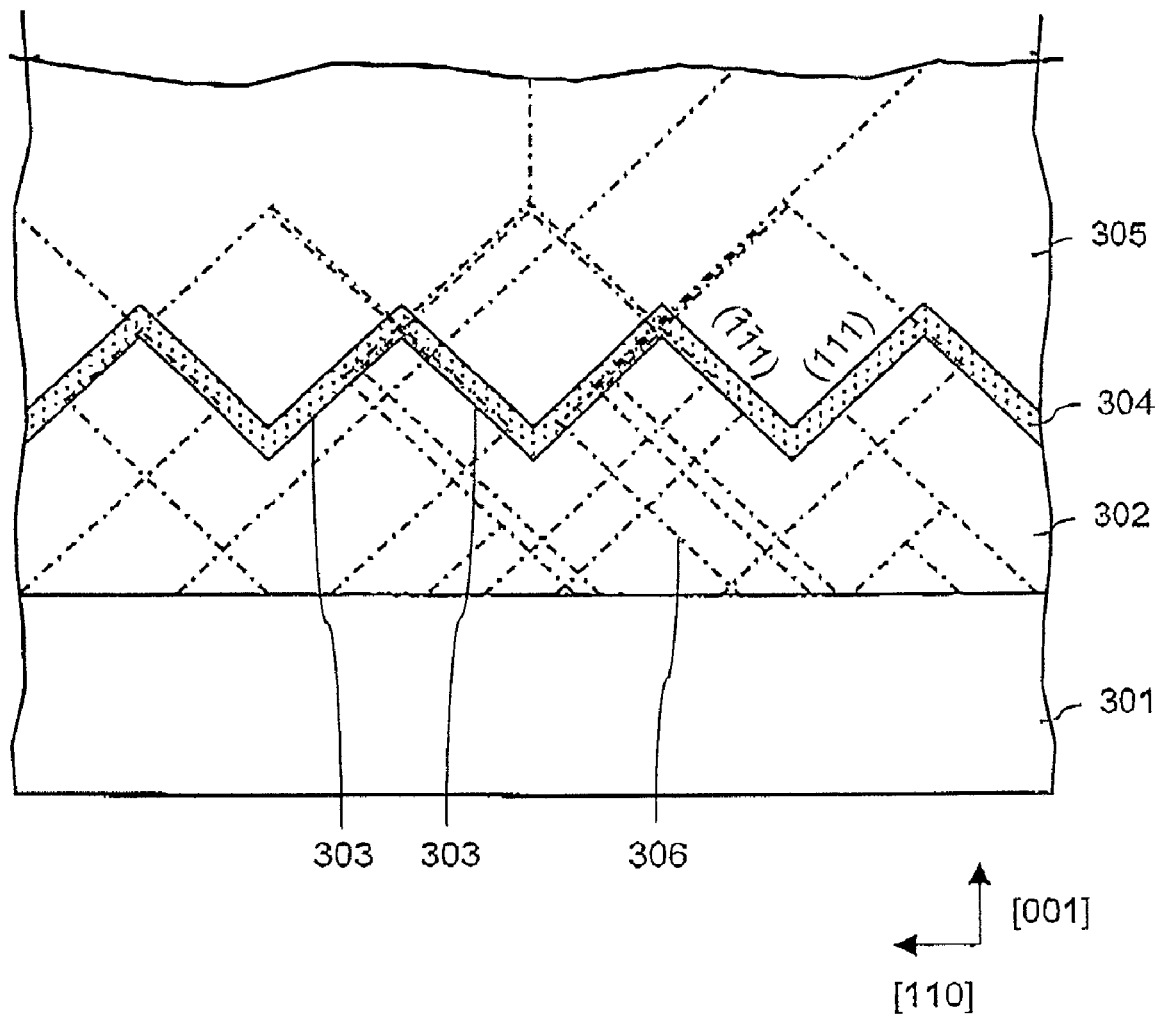
FIG. 5 is a cross sectional view of a third prior art example of a semiconductor device formed on a substrate different in lattice constant therefrom.

In this case the buffer layer contains Ge—C bonding smaller than Si—C bonding in bonding energy, accelerating the development of defects in the buffer layer, which can advance a growth rate with growth temperatures kept high to some extent. The growth rate at this point is preferably 800° C. to 1100° C. In film-forming of the buffer layer 4 defects 7 are produced randomly, and at the same time, defects 6 and 6' being mirror-symmetrical to the axis perpendicular to Si substrate 1, i.e., to the surface orientation of the substrate are produced from angle portions made by facets 2 and 2' and flat portions 3. Subsequently SiC layer 5 next to the buffer layer 4 is formed to obtain a targeted a SiC thin film as shown in FIG. 2E. Vapor deposition method can be used to form the SiC layer 5 as is the same with the formation of the buffer layer. It is advisable to use monomethyl silane $CH_3SiH_3$ as feed gas, for example, and growth temperatures are 800° C. to 1200° C. to ensure good crystallinity. Defects 7 increase in density inside the buffer layer in forming SiC layer 5, contributing to relief from strain. As with the same in the formation of the buffer layer 4, defects 8 and 8' being mirror-symmetrical to the axis perpendicular to Si substrate 1, i.e., to the surface orientation of the substrate are produced simultaneously from angle portions made by the facets and flat portions.

Figure 6:
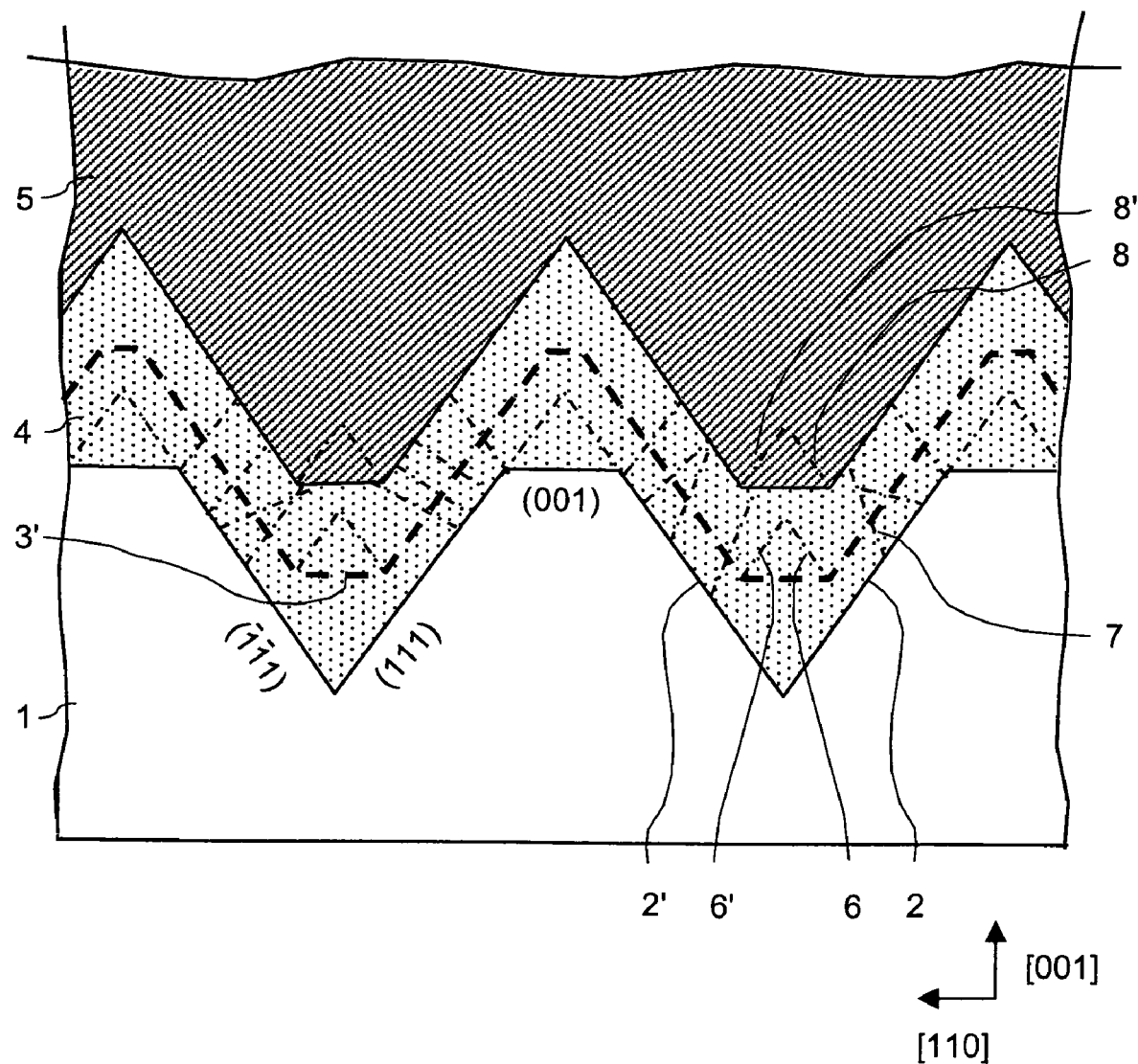
FIG. 6 is a cross sectional view of an embodiment different from FIG. 1 in the first embodiment related to the present invention.

In the formation process of semiconductor thin film mentioned above, defects 6 and 6' and defects 8 and 8' will approach with symmetry kept as they grow, meet and disappear in the buffer layer 4 and SiC layer 5. A large number of defects 7 produced in the buffer layer 4 do not propagate in the SiC layer 5, but are included in layer 4 by producing defects 8 and 8'. These effects make the SiC layer 5 a fewer-defect and high-quality film. Finally, another embodiment without flat portions 3 on the patterned substrate is described with reference to FIG. 6. Controlling growth temperature and pressure so that growth rate in [001] direction is made faster than growth rates in [111] or [−1-11] direction forms flat portions 3' on the bottom of the groove and between grooves. Changing to growth conditions where defects are liable to produce, for example, lowering growth temperature after the formation of the flat portion 3' produces defects in an angle portion made by the flat portion 3' and facets. As mentioned above, defects will disappear after this, enabling the formation of a lower-defect-density SiC layer 5.

SECOND EMBODIMENT

Figure 7:
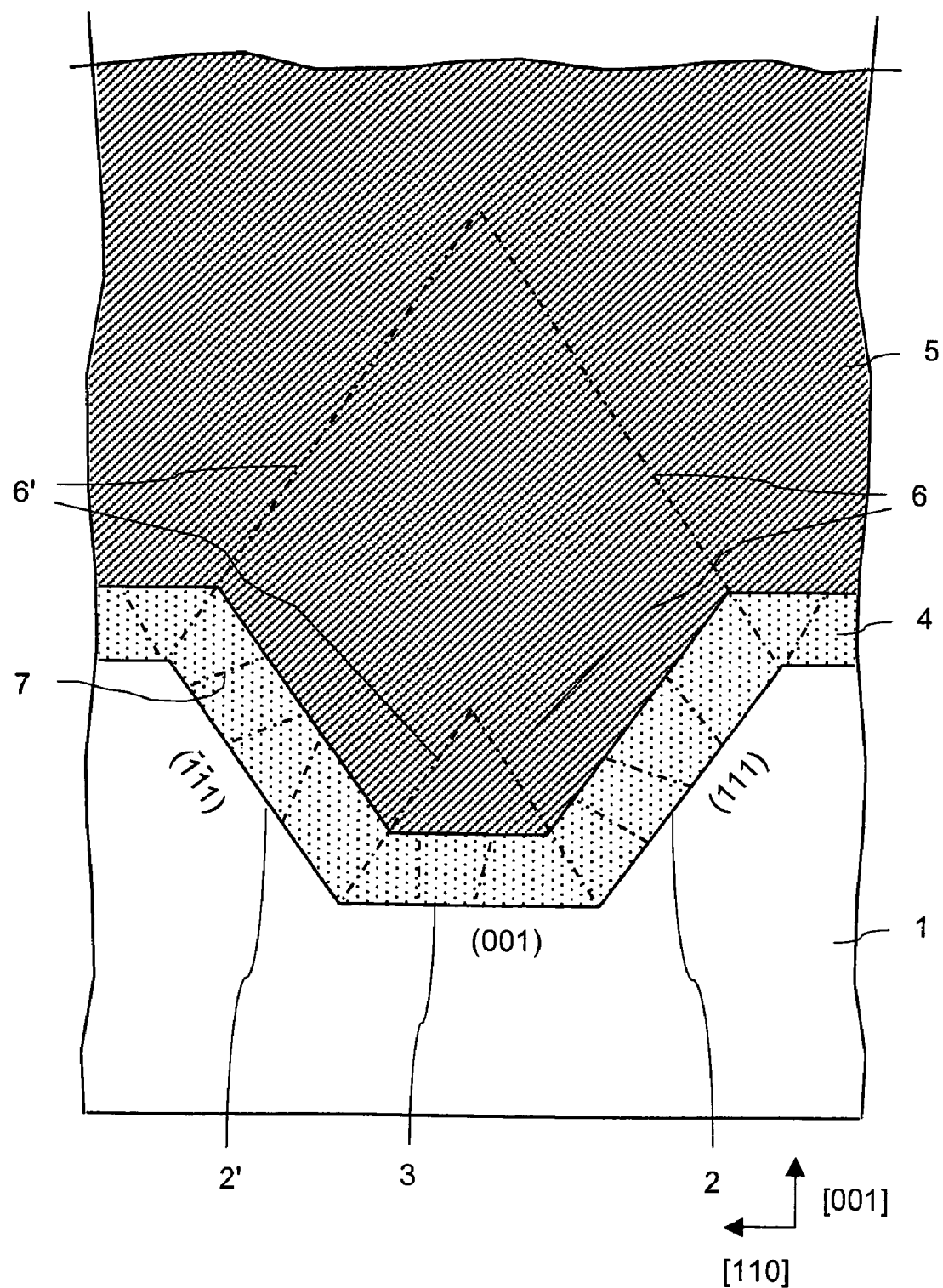
FIG. 7 is a cross sectional view of a second embodiment of a semiconductor device related to the present invention.

The first embodiment describes spontaneous production of defects at an angle portion in forming SiC layer 5. Depending on growth conditions of SiC layer 5 and crystallinity of the buffer layer 4, it may be stable in energy to propagate defects in layer 4 into SiC layer 5 directly. In this situation, defects at angles are not produced in SiC layer 5, a large number of defects produced in the buffer layer 4 will propagate directly into the SiC layer 5. FIG. 7 is a cross sectional view of a semiconductor thin film showing a second embodiment related to the present invention in view of the above description. Here, the same reference characters as in the first embodiment are used, only differences from the first embodiment are extracted to describe. This embodiment is characterized in that the growth rate of (001) and (111) planes is regulated when the buffer layer 4 is grown so that defects 6 and 6' can be always positioned at angles on the bottom of the groove on the surface of the buffer layer 4. This regulation causes defects 6 and 6' extending from the buffer layer 4 to agree with angle portions on the bottom of the groove liable to be subjected to strain in forming the SiC layer 5, and these defects preferentially propagate into the SiC layer 5. This can limit the position where defects are produced in the SiC layer 5 to the angle portions of the bottom of the groove, and on the same principle as in the first embodiment the propagation of defects produced randomly in the buffer layer 4 into the SiC layer 5 can be suppressed. In the present embodiment, the Si substrate with a surface orientation on (001) plane is taken as an example, it is preferable to adjust growth rate or pressure in growth so that the ratio of growth rate in [001] direction at the bottom of the groove to growth rate in [111] direction on the facet is 6 to 7. It is necessary that the thickness of the buffer layer 4 is given an upper limit so that defects 6 and 6' can always meet in the SiC layer 5. If the width of bottom of the groove 3 is taken here as 0.5 μm in the embodiment shown in FIG. 7, the buffer layer can be limited to 0.7 μm or lower in thickness.

THIRD EMBODIMENT

Figure 8:
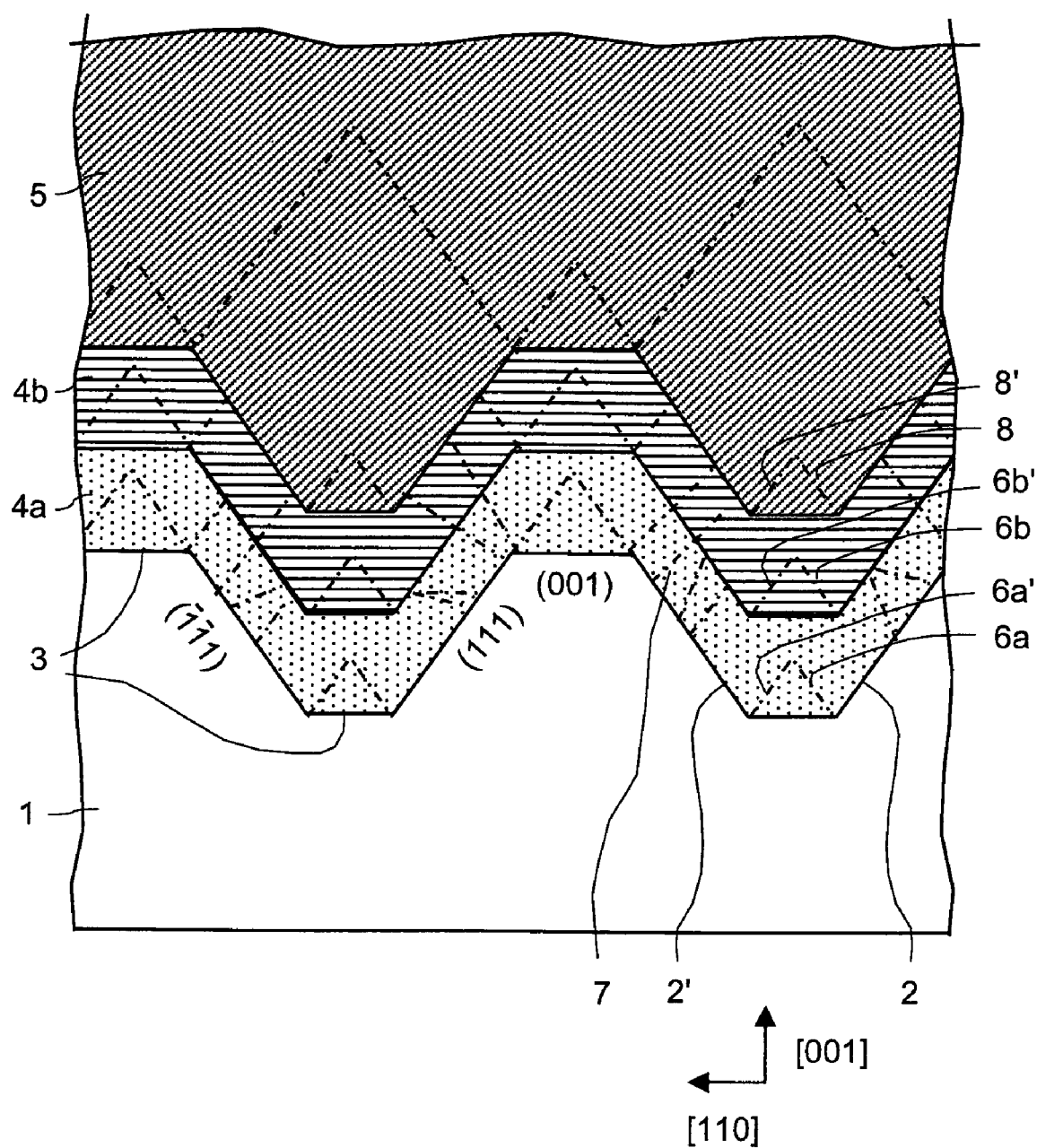
FIG. 8 is a cross sectional view of a third embodiment of a semiconductor device related to the present invention.

FIG. 8 is a cross sectional view of a semiconductor thin film shown in a third embodiment related to the present invention. Description will be made also using the same reference characters as in the first embodiment. In the present embodiment double SiGeC layers 4a and 4b different from each other in Ge composition are used as semiconductor buffer layer 4. Layer 4a right on substrate 1 is characterized by containing more Ge than layer 4b in composition. It is supposed that both the first and the second SiGeC layer 4a and 4b share defects 6a and 6a' and 6b and 6b' produced from angles made by facets and flat portions. Even in the present embodiment, the first SiGeC layer with more Ge—C bonds acts as a buffer for the second SiGeC layer, and the second layer also acts as a buffer for SiC layer 5. This can gradually decrease defects, which will be effective if decrease in defect is not sufficient in the first buffer. In the present embodiment, double SiGeC buffer layers 4 are taken as an example, buffer layer 4 may be comprised of a plurality of layers, three layers or more in which Ge composition is gradually changed. A method for controlling defects in this embodiment may be depended on either the first or the second embodiment.

FOURTH EMBODIMENT

Figure 9:
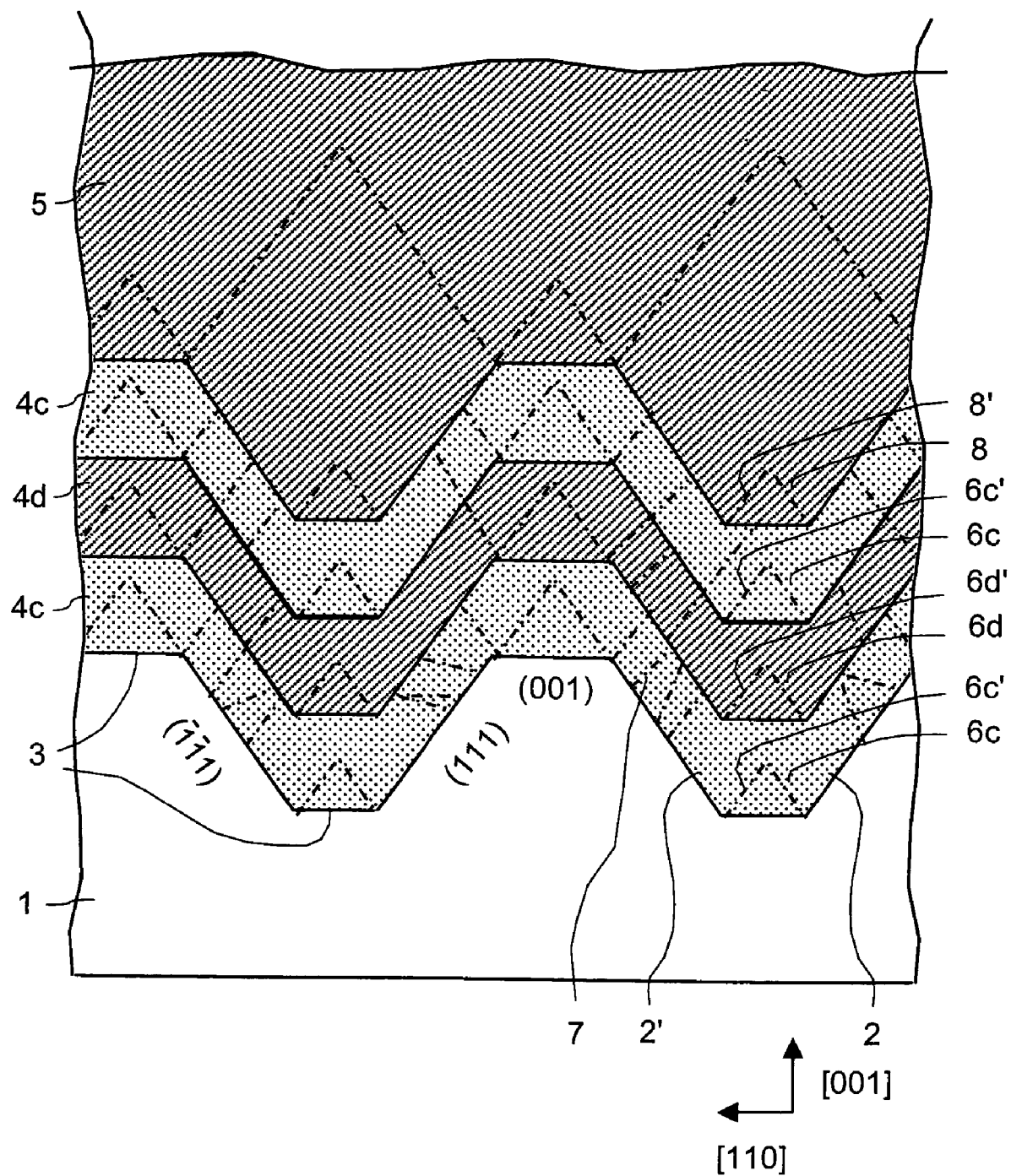
FIG. 9 is a cross sectional view of a fourth embodiment of a semiconductor device related to the present invention.

As with the third embodiment, the fourth embodiment related to the present invention describes a solution to a problem in which a single-layered buffer is insufficient to decrease defects. FIG. 9 shows a cross sectional view of a semiconductor thin film as shown in the present embodiment. The semiconductor buffer layer 4 in the present embodiment is comprised of multiple layers in which buffer layer 4c and SiC layer 4d are repeated alternately. It is preferable to use the SiC layer formed by carbonization, SiC layer grown at lower temperatures, or SiGeC layer as layer 4c described in the first embodiment. In the layers 4c and 4d, defects 6c and 6c' and 6d and 6d' are produced respectively from angles made by facets and flat portions. Repetitive insertion of the buffer layer 4c brings about an effect to relieve gradually strain left in the SiC layer 4d. The reason the defects produced in the buffer layer 4c propagate into the SiC layer 4d is due to strain remaining in the SiC layer 4d. Use of both effects of accelerating relief of strain and of suppressing propagation of defects allows substantial decrease of defects even if defects can not be decreased sufficiently only by a single buffer layer. A method for controlling defects in this embodiment may be depended on either the first or the second embodiment.

FIFTH EMBODIMENT

Figure 10:
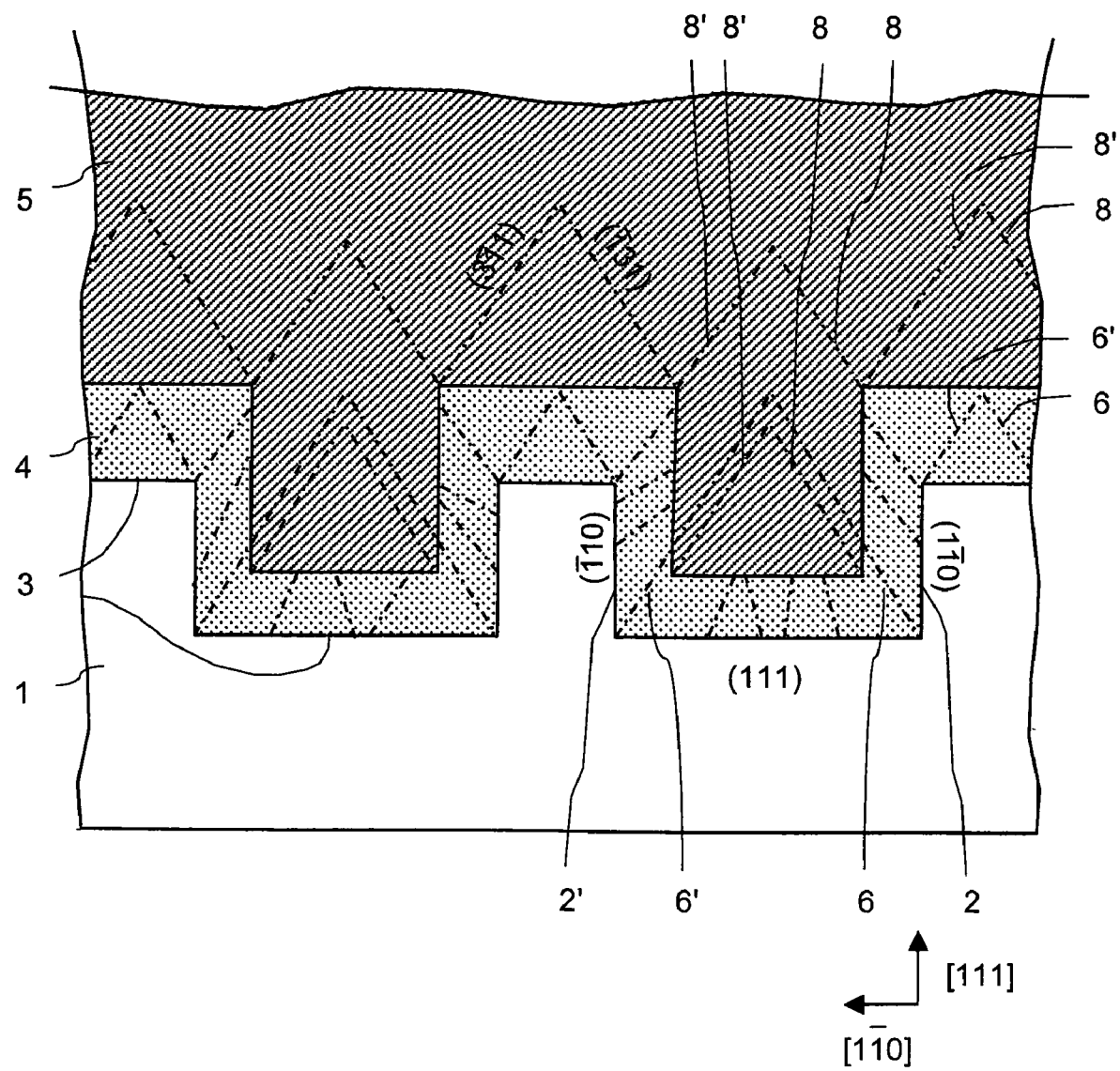
FIG. 10 is a cross sectional view of a fifth embodiment of a semiconductor device related to the present invention.

FIG. 10 is a cross sectional view of a semiconductor thin film shown in a fifth embodiment related to the present invention. The present embodiment is characterized in that (111) Si is used as a substrate, and facets 2 and 2' are comprised with (1-10) and (−110) planes respectively. The same method for patterning Si substrate may be used as in the first embodiment. Since etching rate on (111) plane by anisotropy wet etching is extremely slower than on (001) substrate, it is preferable to conduct anisotropy wet etching after isotropy wet etching. A mixture of hydrofluoric acid (HF) and nitric acid (HNO₃) is best suited for etch liquor in isotropy wet etching. Growing the buffer layer 4 and SiC layer 5 sequentially using the patterned substrate described above will develop plane defects 6 and 6', and 8 and 8' of (3-11) and (-131) planes respectively from angle portions made by facet 2 and 2' and (111) flat portions. As is the case with the first embodiment, these defects meet counterparts respectively, and disappear. The present embodiment is characterized in that (111) SiC thin film can be fabricated. Since (111) SiC surface matches hexagonal crystal thin film, it can be used as a virtual substrate in forming III-nitride semiconductor as material of short-wavelength light emitting device, for example. A method for controlling defects in this embodiment and a buffer layer may be depended on any of the first to the fourth embodiment.

SIXTH EMBODIMENT

Figure 11:
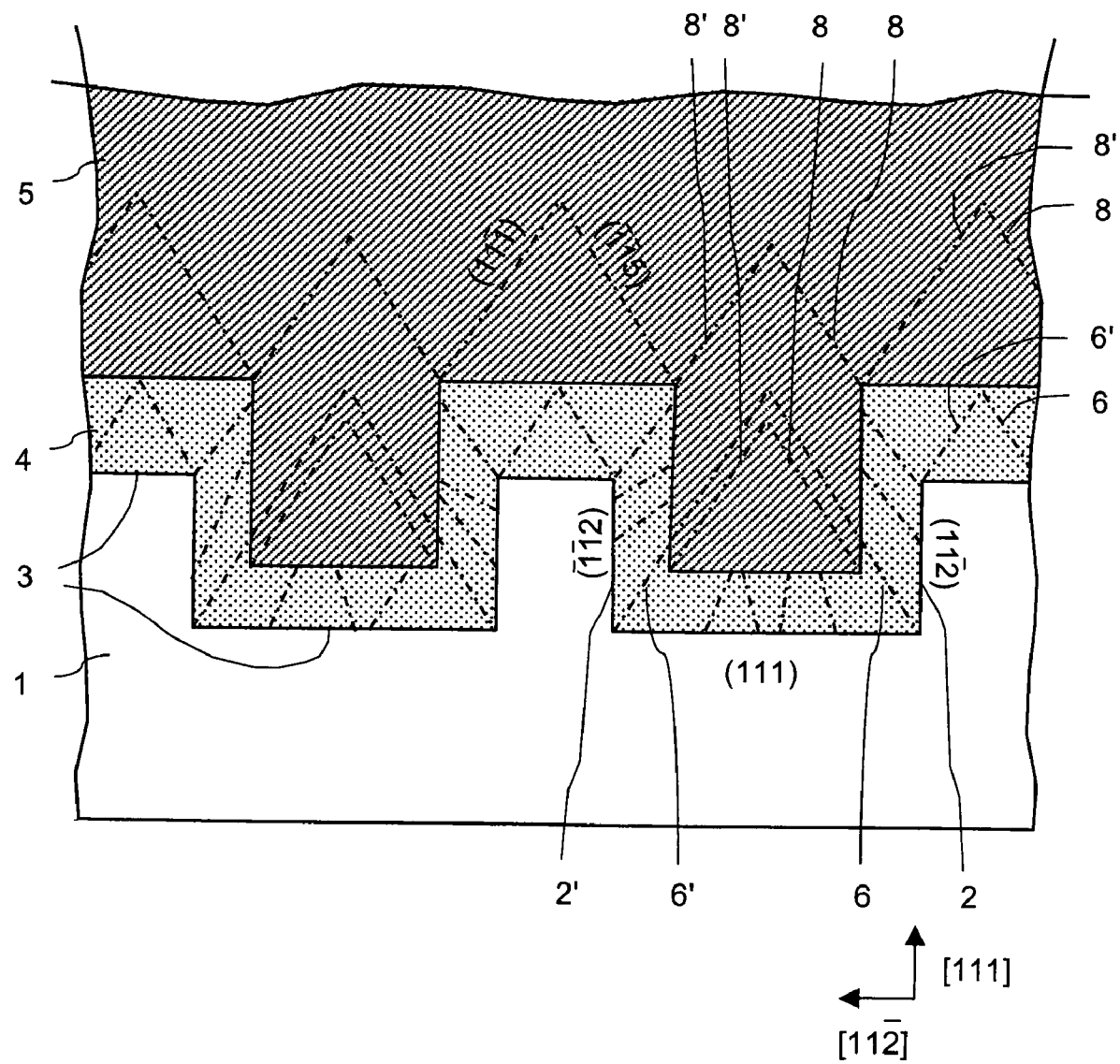
FIG. 11 is a cross sectional view of a sixth embodiment of a semiconductor device related to the present invention.

FIG. 11 is a cross sectional view of a semiconductor thin film shown in a sixth embodiment related to the present invention. In this embodiment a (111) Si is used in a substrate. Its structure is almost the same as in the fifth embodiment. The facets 2 and 2' comprise (11-2) and (-1-12) planes respectively. Plane defects have (11-1) and (-1-15) planes. The present embodiment is a 90 degree-rotated version of the fifth embodiment. A method of embodiment and effects are the same as in the fifth embodiment. A method for controlling defects in this embodiment and a buffer layer may be depended on any of the first to the fourth embodiment.

SEVENTH EMBODIMENT

Figure 12:
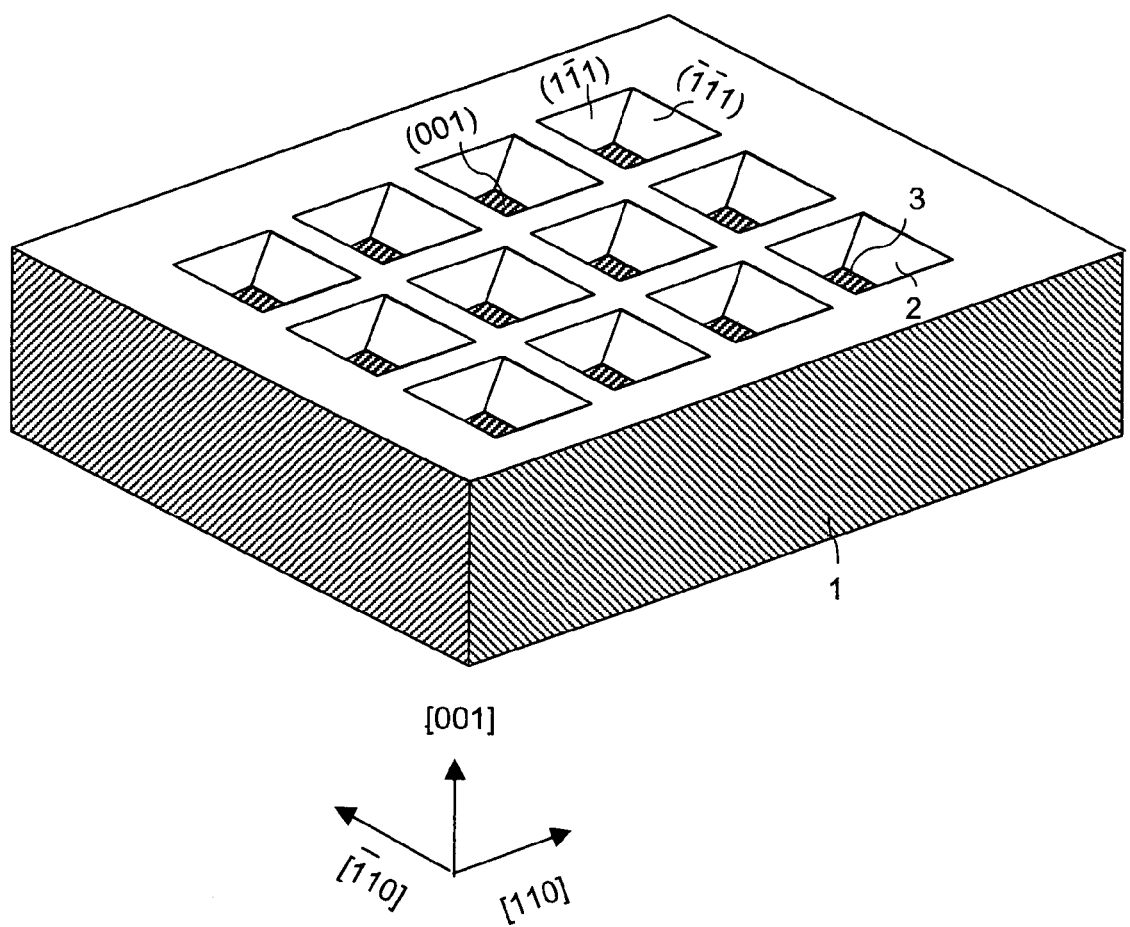
FIG. 12 is a bird's eye view of a seventh embodiment of a semiconductor device related to the present invention.

FIG. 12 is a bird's eye view of a just patterned (001) Si substrate shown in a seventh embodiment related to the present invention. The present embodiment is characterized in that four facets 2 having (111), (-1-11), (1-11), and (-111) planes respectively form a rectangular groove on (001) Si substrate 1. In the first to sixth embodiments, the grooves formed by facets 2 have one dimensional structure extending to one direction, which makes it difficult to control the position of defects to the direction in which the grooves are arranged. The present embodiment, however, makes it possible to control the position of defects two-dimensionally by forming the rectangular grooves, which also allowing further decrease in density of defects in the SiC layer. A method for controlling defects in this embodiment and a buffer layer may be depended on any of the first to the fourth embodiment.

EIGHT EMBODIMENT

Figure 13:
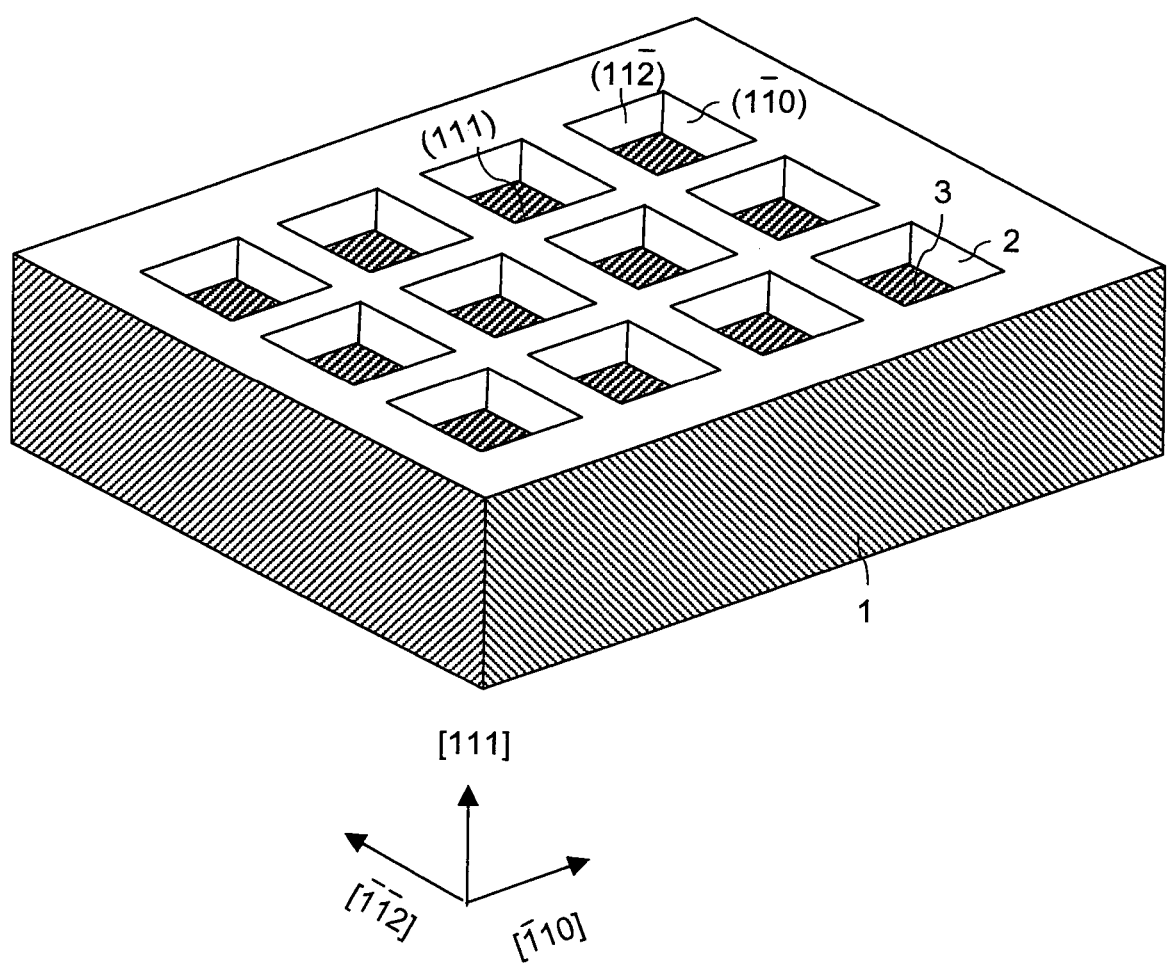
FIG. 13 is a bird's eye view of an eighth embodiment of a semiconductor device related to the present invention.

FIG. 13 is a bird's eye view of a just patterned (111) Si substrate shown in an eighth embodiment related to the present invention. The present embodiment is characterized in that four facets 2 having (1-10), (-110), (11-2), and (-1-12) planes respectively form rectangular grooves on (111) Si substrate 1. The present embodiment is an example in which the same effect as in the seventh embodiment is achieved using (111) Si substrate. It enables two-dimensional control of the position of defects, providing a high-quality (111) SiC virtual substrate whose defects are further decreased as compared with the fifth and sixth embodiments. A method for controlling defects in this embodiment and a buffer layer may be depended on any of the first to the fourth embodiment.

NINTH EMBODIMENT

Figure 14:
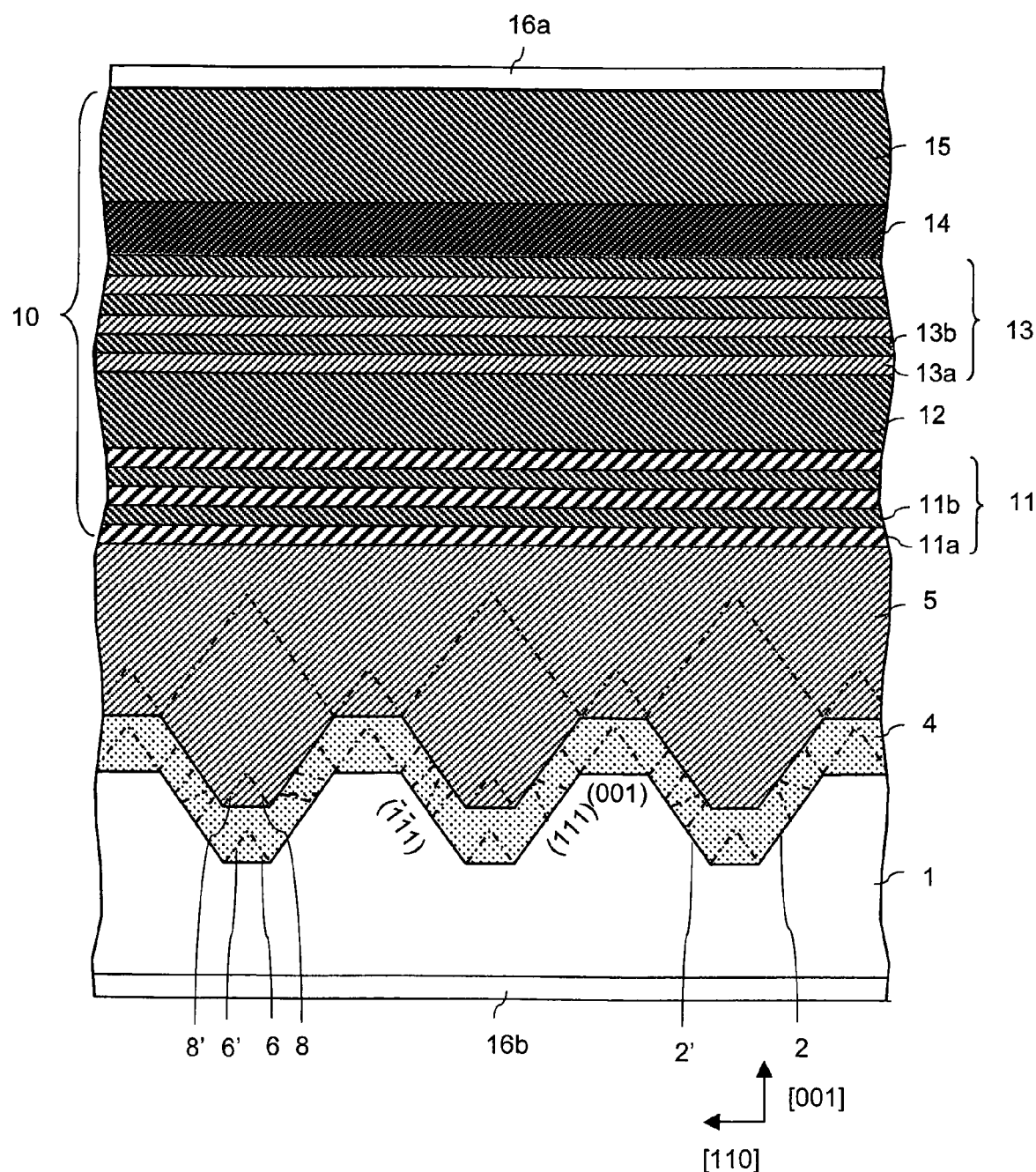
FIG. 14 is a cross sectional view of a ninth embodiment of a semiconductor device related to the present invention.

FIG. 14 is a cross sectional view showing a ninth embodiment related to the present invention. The present embodiment is characterized in that a light emitting element 10 comprised of III-nitride semiconductor is formed on a high quality SiC thin film 5 obtained by any method of the first to the eighth embodiment. Although FIG. 14 shows an example in which light emitting element 10 is formed on the SiC thin film provided by the first embodiment, the SiC thin film 5 may be the film shown in the second to the eighth embodiment. Since the SiC thin film 5 in the present embodiment is used as a virtual substrate for light emitting element 10, a film thickness is preferably 2 μm to 3 μm or more. Element 10 comprised of III-nitride semiconductor is grown by metal organic vapor phase epitaxy (MOVPE) method or gas-source molecular beam epitaxy (GSMBE) method, and is structured by laminating one on top of another a multi-layer reflection film 11 comprised of an aluminum nitride (AlN) layer 11*a* and a gallium nitride (GaN) layer 11*b* each being 3 nm to 10 nm in thickness, a clad layer 12 of an about 50-nm-thick n-type GaN layer, a light emitting layer 13 comprised of a multiple quantum well of an indium gallium nitride (InGaN) layer 13*a* and a GaN layer 13*b* each being 3 nm to 5 nm in thickness, a clad layer 14 of an about 20-nm-thick p-type aluminum gallium nitride (AlGaN) layer, and an about 200-nm-thick p-type GaN layer 15. On the surface of the light emitting element is evaporated a transparent electrode 16*a* comprised of an alloy of nickel (Ni) and gold (Au). On the back side of the substrate is evaporated electrode 16*b* comprised of an alloy (AuSb) of gold (Au) and antimony (Sb). Element 10 is formed on the high quality SiC layer 5 of which defects are decreased, so that it provides highly-efficient and longer-lifetime light emission. The use of an industrially inexpensive Si substrate therein enables the cost reduction of the element.

TENTH EMBODIMENT

Figure 15:
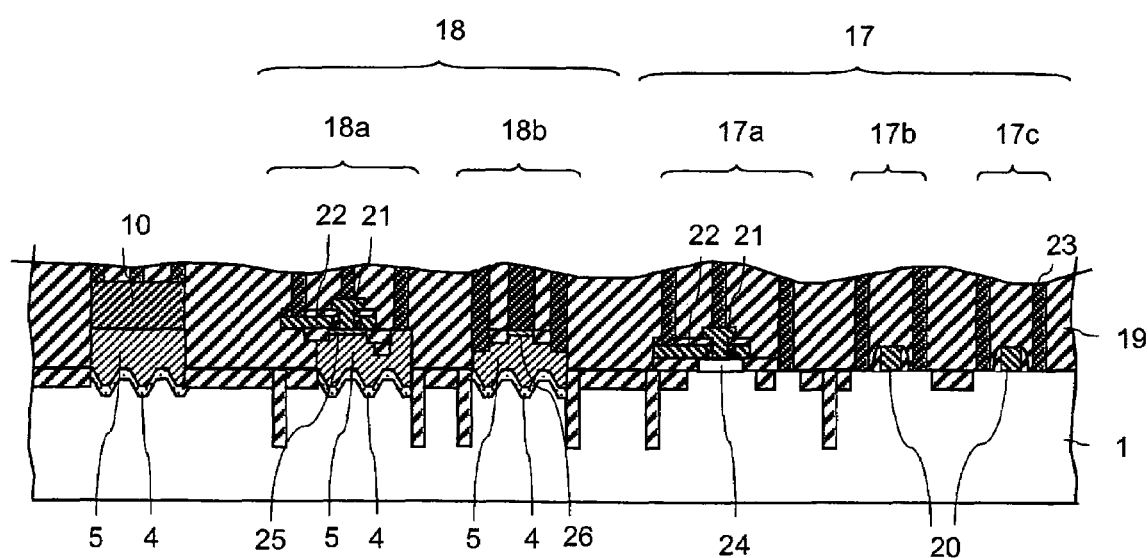
FIG. 15 is a cross sectional view of a tenth embodiment of a semiconductor device related to the present invention.

FIG. 15 is a cross sectional view showing a tenth embodiment related to the present invention. In the present embodiment a high quality SiC thin film 5 obtained by any method of the first to the eight embodiment is provided on a part of Si substrate 1 and element 10 described in the ninth embodiment is provided on a part of SiC thin film 5. Further, on Si substrate 1 is provided a high frequency electronic device 17 comprised of a bipolar complementary metal-oxide-semiconductor (BICMOS) with a hetero biplar transistor (HBT) using p-type silicon germanium (SiGe) layer as a base layer. On SiC thin film 5 is provided a high-output and high-withstand-voltage electronic device 18 comprised of at least HBT 18*a* or a high-electron-mobility transistor (HEMT) 18*b*. In a base portion of HBT 18*a* is used a p-type SiGeC layer 25. In a channel portion of HEMT 18*b* is used an n-type SiGeC layer 26. A method for forming BICMOS 17 and HBT 18*a* is disclosed in Japanese Patent Laid-Open Application Publication No. 2002-141476, for example, and HEMT 18*b* in Japanese Patent Application Laid-Open Publication No. 2001-24192, for example. The present embodiment enables the hybridization of the light emitting element 10, the high frequency electronic device 17 and the high-output and high-withstand-voltage electronic device 18 on Si substrate 1, and the integration of a variety of functions on a single substrate.

ELEVENTH EMBODIMENT

Figure 16:
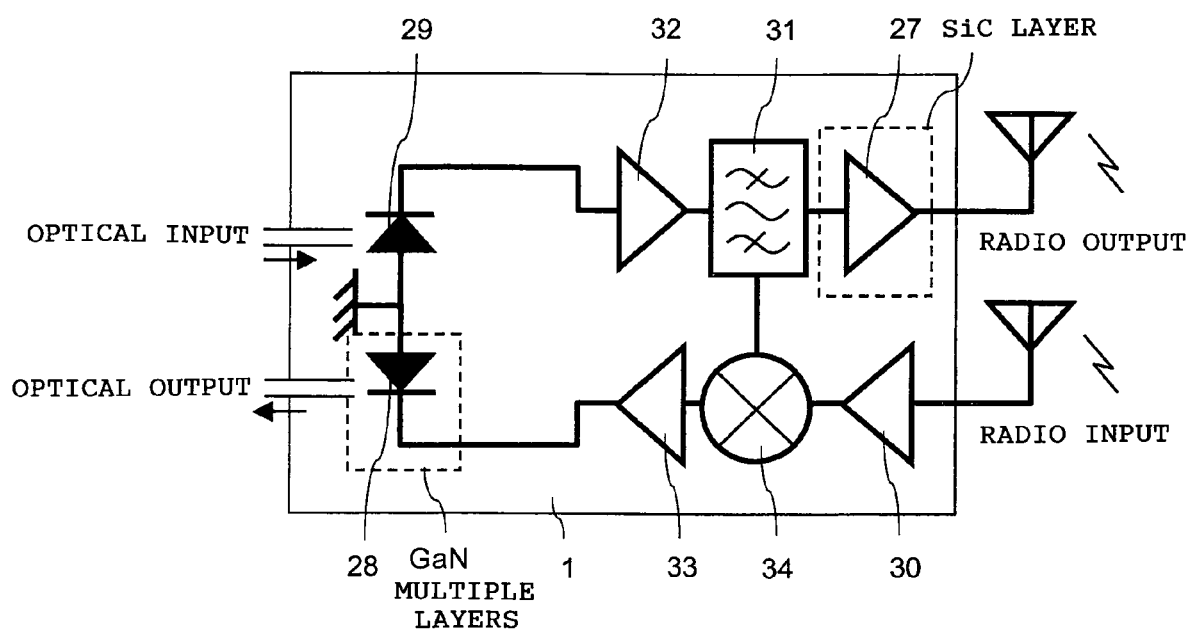
FIG. 16 is a circuit block diagram of an eleventh embodiment of a semiconductor device related to the present invention.

FIG. 16 is a circuit block diagram showing an eleventh embodiment related to the present invention. The present embodiment is one of applications of the tenth embodiment, and an optical-fiber radio system capable of converting optical signals and radio signals on a single Si substrate. The system is an optical/wireless communication system comprised of a high-output amplifier 27 and laser diode 28 using a high-output electronic device and a light emitting element formed on Si substrate 1 based on the tenth embodiment. In the III-nitride semiconductor layer composing the laser diode 28, its material is selected and its composition is controlled so that it emits light with a wavelength of 1.3 μm to 1.5 μm. A photo diode 29 may be formed from the III-nitride semiconductor layer. The formation of other circuits 30 to 34 with use of SiGe BiCMOS excellent in speed permits the system to further upgrade performances. The present embodiment allows light emitting function and high-output radio transmission function to be integrated onto an inexpensive silicon substrate, which had been difficult so far to achieve this, realizing a low-cost, high function and high performance device on a single chip.

While the present invention has been described in several preferred embodiments, it will be understood that it is not limited to the above embodiments but is susceptible of proper modifications in design without departing from the spirit and scope thereof. For example, Si has been used in substrate 1, and SiC in the first semiconductor layer in the embodiments, however, it is to be understood that Si, sapphire, or SiC may be used in a substrate, and the first semiconductor layer may be formed from GaN.

A smaller threading-dislocation and high-quality SiC thin film can be formed on a SiC substrate according to the semiconductor device and the production method therefor related to the present invention. This enables the use of the SiC thin film on the Si substrate as SiC electronic device, and as a virtual substrate for forming a III-nitride semiconductor as well. As a result, this makes it possible to form a high withstand-voltage and high-output electronic device superior in performances to existing Si devices and an ultraviolet-blue light-emitting element on an industrially inexpensive Si substrate.

What is claimed is:

1. A semiconductor device comprising:
    a semiconductor substrate on the upper portion of which a plurality of pairs of opposing facets are arranged;
    a semiconductor buffer layer provided on the semiconductor substrate and being higher in defect density than the semiconductor substrate; and
    a first semiconductor layer provided on the semiconductor buffer layer, being different from the semiconductor substrate in lattice constant, and containing constituent elements different from the semiconductor substrate, wherein the facets are different from the semiconductor substrate in surface orientation and respective pairs of facets each comprised of opposing two facets are mirror-symmetrical to the surface orientation of the semiconductor substrate.

2. The semiconductor device according to claim 1, wherein a plurality of pairs of defects being mirror-symmetrical to the surface orientation of the semiconductor substrate exist in the semiconductor buffer layer and the first semiconductor layer, and defects in each the layer gradually decrease in number toward the surface of the first semiconductor layer.

3. The semiconductor device according to claim 1, wherein the semiconductor buffer layer is lower than the first semiconductor layer in mechanical strength or interatomic bonding energy.

4. The semiconductor device according to claim 1, wherein the semiconductor buffer layer is comprised of a plurality of layers each being different from one another in element composition, and the element composition therein gradually gets close to that in the first semiconductor layer as the composition in the semiconductor substrate gets close to that in the first semiconductor layer.

5. The semiconductor device according to claim 1, wherein the semiconductor buffer layer has a multiple layered structure in which a first semiconductor buffer layer being lower than the first semiconductor layer in mechanical strength or interatomic bonding energy and a second semiconductor buffer layer being higher than the first semiconductor buffer layer in mechanical strength or interatomic bonding energy are repeated alternately.

6. The semiconductor device according to claim 1, wherein an electronic device or light emitting element is provided on the first semiconductor layer.

7. The semiconductor device according to claim 1, wherein a second semiconductor layer comprised of a plurality of nitrogen-containing III-V semiconductor layers is provided on the first semiconductor layer, and an electronic device or light emitting element is provided on the second semiconductor layer and/or the first semiconductor layer and/or the semiconductor substrate.

8. The semiconductor device according to claim 1, wherein the semiconductor substrate comprises silicon, the semiconductor buffer layer comprises a material containing silicon, germanium, and carbon, and the first semiconductor layer comprises a compound semiconductor containing silicon-carbon coupling.

9. A semiconductor device comprising:
    a semiconductor substrate on the upper portion of which a plurality of pairs of opposing facets are arranged along the perpendicular directions respectively;
    a semiconductor buffer layer provided on the semiconductor substrate and being higher in defect density than the semiconductor substrate; and
    a first semiconductor layer provided on the semiconductor buffer layer, being different from the semiconductor substrate in lattice constant, and containing constituent elements different from the semiconductor substrate, wherein the facets are different from the semiconductor substrate in surface orientation and respective pairs of facets each comprised of opposing two facets are mirror-symmetrical to the surface orientation of the semiconductor substrate.

10. The semiconductor device according to claim 9, wherein the respective perpendicular directions along which the opposing facets are arranged are [−110] and [110], and [1-12] and [110].

11. The semiconductor device according to claim 9, wherein the semiconductor substrate has a surface orientation of (001), the respective opposing facets comprise (111) and (−1-11), and (−111) and (1-11) planes, an area surrounded by the facets forms a rectangular pattern on the surface of the semiconductor substrate, and the semiconductor buffer layer is formed throughout the semiconductor substrate.

12. The semiconductor device according to claim 9, wherein the semiconductor substrate has a surface orientation of (111), the respective opposing facets comprise (1-10) and (−110), and (11-2) and (−1-12) planes, an area surrounded by the facets forms a rectangular pattern on the surface of the semiconductor substrate, and the semiconductor buffer layer is formed throughout the semiconductor substrate.

13. The semiconductor device according to claim 9, wherein a plurality of pairs of defects being mirror-symmetrical to the surface orientation of the semiconductor substrate exist in the semiconductor buffer layer and the first semiconductor layer, and defects in each the layer gradually decrease in number toward the surface of the first semiconductor layer.

14. The semiconductor device according to claim 9, wherein the semiconductor buffer layer is lower than the first semiconductor layer in mechanical strength or interatomic bonding energy.

15. The semiconductor device according to claim 9, wherein the semiconductor buffer layer is comprised of a plurality of layers each being different from one another in element composition, and the element composition therein gradually gets close to that in the first semiconductor layer as the composition in the semiconductor substrate gets close to that in the first semiconductor layer.

16. The semiconductor device according to claim 9, wherein the semiconductor buffer layer has a multiple layered structure in which a first semiconductor buffer layer being lower than the first semiconductor layer in mechanical strength or interatomic bonding energy and a second semiconductor buffer layer being higher than the first semiconductor buffer layer in mechanical strength or interatomic bonding energy are repeated alternately.

17. The semiconductor device according to claim 9, wherein an electronic device or light emitting element is provided on the first semiconductor layer.

18. The semiconductor device according to claim 9, wherein a second semiconductor layer comprised of a plurality of nitrogen-containing III-V semiconductor layers is provided on the first semiconductor layer, and an electronic device or light emitting element is provided on the second semiconductor layer and/or the first semiconductor layer and/or the semiconductor substrate.

19. The semiconductor device according to claim 9, wherein the semiconductor substrate comprises silicon, the semiconductor buffer layer comprises a material containing silicon, germanium, and carbon, and the first semiconductor layer comprises a compound semiconductor containing silicon-carbon coupling.

20. A semiconductor device, wherein a semiconductor buffer layer containing Si in part and being higher in defect density than a Si substrate is formed on the Si substrate on the upper portion of which a plurality of pairs of facets being mirror-symmetrical to the surface orientation of a semiconductor substrate are formed, and a SiC layer is sequentially formed on the semiconductor buffer layer.

21. A semiconductor device comprising:
a semiconductor substrate on the upper portion of which a plurality of pairs of opposing facets are arranged;
a semiconductor buffer layer provided on the semiconductor substrate and having a larger number of defects than the semiconductor substrate; and
a first semiconductor layer provided on the semiconductor buffer layer, being different from the semiconductor substrate in lattice constant, and containing constituent elements different from the semiconductor substrate, wherein the facets are different from the semiconductor substrate in surface orientation and respective pairs of facets each comprised of opposing two facets are mirror-symmetrical to the surface orientation of the semiconductor substrate.

* * * * *